United States Patent [19]
Brandstetter

[11] Patent Number: 4,513,167
[45] Date of Patent: Apr. 23, 1985

[54] ARRAYS OF POLARIZED ENERGY-GENERATING ELEMENTS

[75] Inventor: Aharon Brandstetter, Torrens, Australia

[73] Assignee: The Australian National University, Australia

[21] Appl. No.: 573,926

[22] PCT Filed: Apr. 18, 1983

[86] PCT No.: PCT/AU83/00045
§ 371 Date: Dec. 20, 1983
§ 102(e) Date: Dec. 20, 1983

[87] PCT Pub. No.: WO83/03925
PCT Pub. Date: Nov. 10, 1983

[30] Foreign Application Priority Data
Apr. 27, 1982 [AU] Australia ............... PF3735

[51] Int. Cl.³ ........................................... H01L 31/04
[52] U.S. Cl. ................... 136/244; 136/205; 136/206; 136/293; 320/7; 320/16; 323/906; 361/328; 429/149; 429/156
[58] Field of Search ............... 136/244, 291, 293, 205, 136/206, 212; 323/906; 429/121, 123, 149, 156, 158, 159; 320/7, 16; 361/328

[56] References Cited
U.S. PATENT DOCUMENTS

| | | | |
|---|---|---|---|
| 3,672,999 | 6/1972 | Barbera | 136/245 |
| 3,912,539 | 10/1975 | Magee | 136/244 |
| 4,040,867 | 8/1977 | Forestieri et al. | 136/244 |
| 4,249,959 | 2/1981 | Jebens | 136/244 |
| 4,350,836 | 9/1982 | Crouthamel et al. | 136/244 |
| 4,367,365 | 1/1983 | Spencer | 136/244 |
| 4,409,537 | 10/1983 | Harris | 320/7 |

OTHER PUBLICATIONS

Solar Energy, vol. 26, No. 5, issued 1981, Feldman et al., "Solar Cell Interconnections and the Shadow Problem", pp. 419–428.

Primary Examiner—Aaron Weisstuch
Attorney, Agent, or Firm—Harness, Dickey & Pierce

[57] ABSTRACT

Two-dimensional arrays of polarized energy-generating or energy-storing elements (20A, 20B, ..., 20D; 21A, ..., 21D; 22A, ..., 22D; 23A, ..., 23D; 24A, ..., 24D; 25A, ..., 25D), such as solar cells, batteries, thermoelectric generators or capacitors are formed as a matrix of rows and columns of elements, with the elements of each column being connected in series and the junctions between the series-connected elements in each column within the matrix being connected, in sequence, first to the corresponding junction in one of the adjacent columns and then to the corresponding junction in the other one of the adjacent columns. By connecting the junctions (32, 33) of alternate pairs of elements in the left hand column of the matrix to the respective junctions (32A, 33A) in the right hand column of a matrix having an even number of columns, the mathematical equivalent of a tubular matrix of elements is formed. When the invention is applied to arrays of solar cells, the problems due to shadowing the array are diminished.

30 Claims, 10 Drawing Figures (a) PRIOR ART (b) PRIOR ART

ARRAYS OF POLARISED ENERGY-GENERATING ELEMENTS

TECHNICAL FIELD

This invention concerns two-dimensional arrays of polarised energy-generating or energy storage elements. Such energy-generating elements include batteries, thermoelectric generators and solar cells; an example of such an energy storage element is a capacitor. For convenience, energy-generating and storage elements will be referred to, generically, in this specification as energy-generating elements. Because the present inventor has a particular interest in solar cell technology, and the invention was developed and tested using arrays of solar cells, the invention will be described with emphasis on solar cell arrays.

BACKGROUND ART

It is usual to connect two-dimensional arrays of polarised energy-generating elements in series or in a series-parallel arrangement (these arrangements are illustrated in the accompanying drawings). A long-standing problem with such conventional arrays is that when one element in the array changes its operating characteristics adversely, the output of the entire array is substantially reduced. For example, in a series-connected array of lead-acid batteries, if a cell of one of the batteries collapses and becomes a high-resistance element, the output of the entire array of batteries is reduced due to the high internal resistance of the array created by the failed cell. Again, in an array of solar cells, the output of a series-connected array or a series-parallel connected array is markedly reduced when one cell in the array fails, or when one or more of the cells of the array are in shadow. Shadowing can occur in many ways, as persons who are familiar with the use of solar cells in terrestrial and satellite applications know well.

The problem of shadowing and cell failure in arrays of solar cells has been partly overcome in the past by incorporating into the array a number of protective diodes. Usually one diode acts to shunt a number of cells in the array, but it only becomes operative when, due to shadowing or cell malfunction, a cell in that number develops a high resistance and reduced output capability. This approach to the problem is effective, but is both costly (when a large number of diodes are required to provide protection for the array) and wasteful (because the output of a number of fully functional solar cells is excluded from the power generated by the array, even though only one solar cell is shadowed or has failed).

A recent attempt to overcome the problem of cell shadowing without using protective diodes in an array of solar cells has been reported by J. Feldman, S. Singer and A. Braunstein in their paper entitled "Solar cell interconnections and the shadow problem". This paper appeared in Volume 26, (1981) of the journal "Solar Energy", at pages 419 to 428. In this paper, Feldman et al discuss the problem of shadowing, and conclude that a random interconnection of the cells of an array (instead of the conventional series connection of series-parallel connection) can be used to reduce the adverse effect of shadowing without resorting to the inclusion in the array of protective diodes. Not only do Feldman et al demonstrate the apparent advantages of their stochastic or random-chance method of cross-linking their solar cells, but they specifically note in their paper that when regular patterns of cross-linking were adopted, a serious decrease in output of the array was experienced (see page 421 of the reference, second column, at lines 6 to 10).

The generation of quasi-random or random cross-linking for the elements in arrays of polarised energy-generating elements, and then effecting such a cross-linking arrangement, is necessarily more inconvenient and time-consuming than the adoption of a regular cross-linking arrangement of such elements. It is, therefore, an objective of the present invention to provide a regular cross-linking arrangement for arrays of such elements, which overcome the problems of shadowing (in the case of solar cells) and partial or complete failure of elements, without recourse to protective diodes.

DISCLOSURE OF THE PRESENT INVENTION

The objective of the present invention is achieved by the equivalent of forming a regular matrix of the polarised energy-generating elements as a number of rows and columns of the elements, with the elements in each row and column being polarised in the same direction, and, within the matrix:

(a) connecting the positive pole of each element in each column with the negative pole of the next adjacent element in the column;

(b) connecting together the positive pole of each second element in a column and the positive pole of the corresponding element (that is, the element in the same row) of one of the two adjacent columns; and (c) connecting the positive pole of each alternate second element in a column with the positive pole of the corresponding element (that is, the element in the same row) in the other of the two adjacent columns.

The connections between the elements at the edges of the matrix will depend upon the use to which the matrix is to be put.

An alternative way of regarding the matrix described above is as a regular matrix of rows and columns of elemental polarised groups, each group being polarised in the same direction and comprising four energy-generating elements, connected as two elements in series, in parallel with the other two elements in series; with (a) each group in a column of the matrix being connected in series with the other groups in the same column; and (b) each juntion between two elements in series in a group being connected to the nearest junction between series-connected elements in the corresponding group in the adjacent column of groups.

Provided there are an even number of columns in the matrix, the two side edges of the matrix can be interconnected to form what is mathematically the equivalent of a tubular array of elements or groups of elements.

The present inventor has coined the term "bridge-linked arrays" for arrays of energy-generating elements constructed in accordance with the present invention.

Bridge-linked arrays of solar cells, constructed in accordance with the present invention, have been shown experimentally to have an output characteristic when unshaded which is no worse than a series-parallel connected array of solar cells having the same number of cells in the array and with protective diodes present, and a significantly improved output when some of the cells of the array are in shadow.

For a better understanding of the present invention, the following description is provided, in which reference will be made to the accompanying drawings.

DETAILED DESCRIPTION OF ILLUSTRATED EMBODIMENTS

Figure 1:
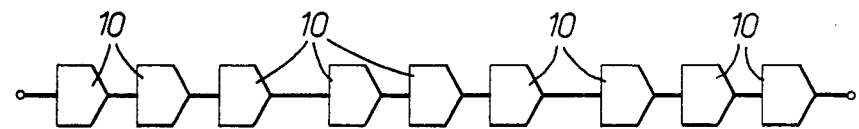
FIG. 1 is a diagram of a prior art series-connected array of polarised energy-generating elements, (a) without protective diodes and (b) with protective diodes.
Figure 1:
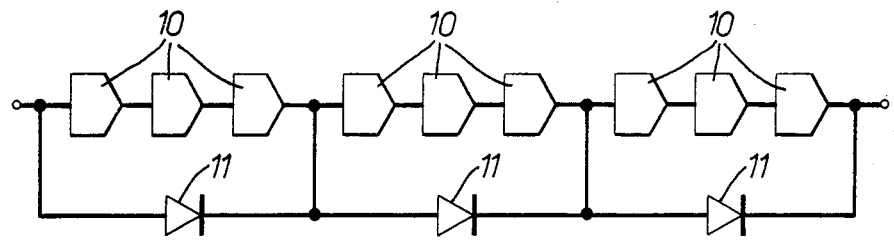
Figure 2A:
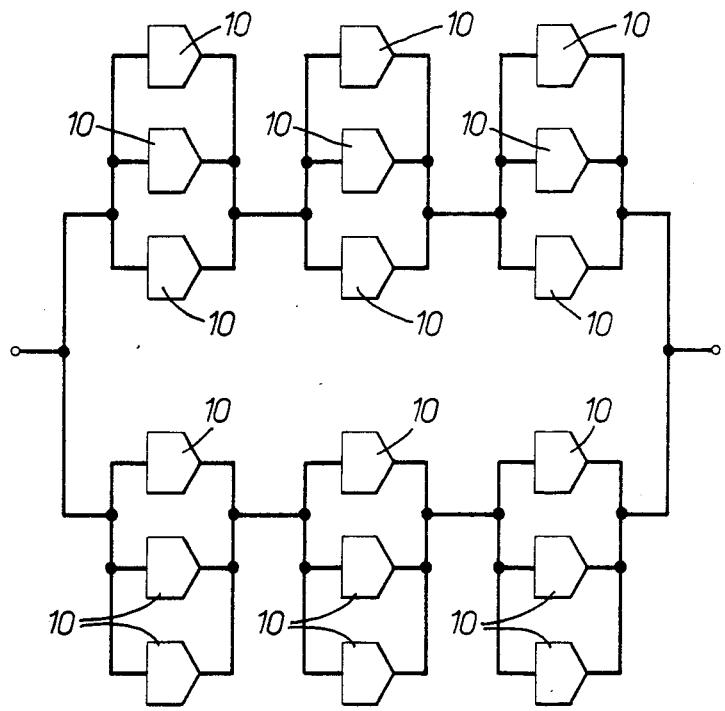
FIG. 2 is a diagram of a prior art series-parallel connected array of polarised energy-generating elements, (a) without protective diodes and (b) with protective diodes.
Figure 2B:
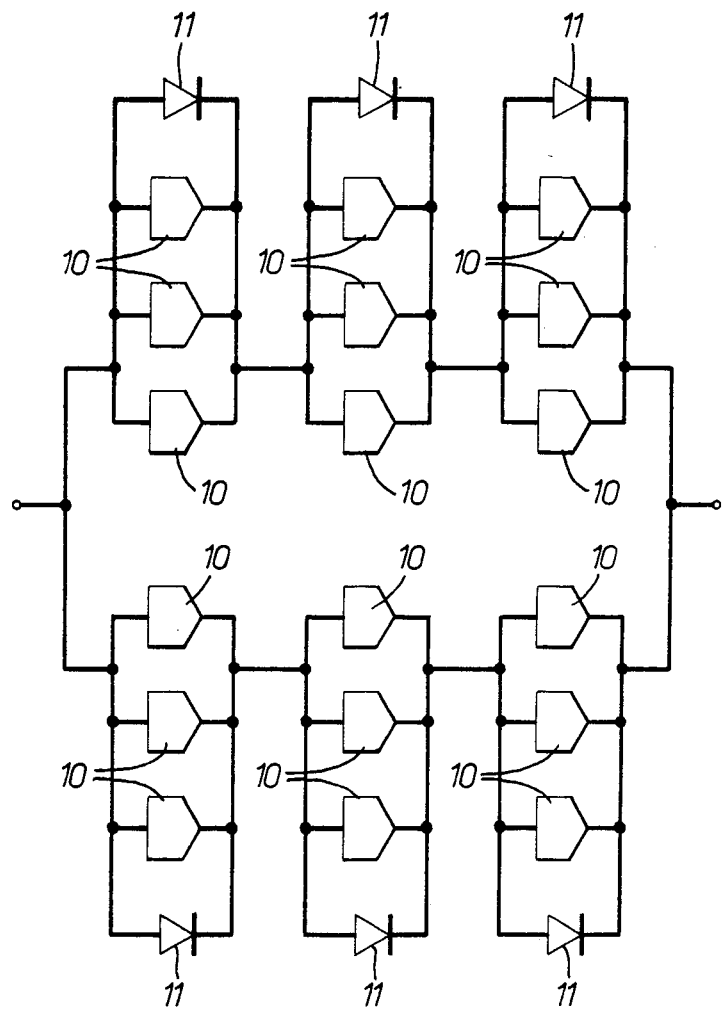

In FIGS. 1 and 2, the arrays of polarised energy-generating elements 10 (which, as indicated above, may be solar cells, batteries, thermo-electric generators, or capacitors or the like) are connected in the conventional series-connection (FIG. 1(a)) and series-parallel connection (FIG. 2(a)). In FIGS. 1(b) and 2(b), a protective diode 11 shunts a group of three elements 10. If all the elements of the arrays in FIGS. 1(b) and 2(b) are functioning normally, the internal resistance of each element is small and none of the diodes 11 is conducting. However, if one element should fail, or otherwise become an element with a high internal resistance, the diode 11 which protects the group of three elements in which the failed element is located conducts, thus shunting out that group of elements. As indicated earlier in this specification, such shunting when a diode becomes conducting effectively deletes the contribution of two fully-effective elements from the output of the array.

Figure 3:
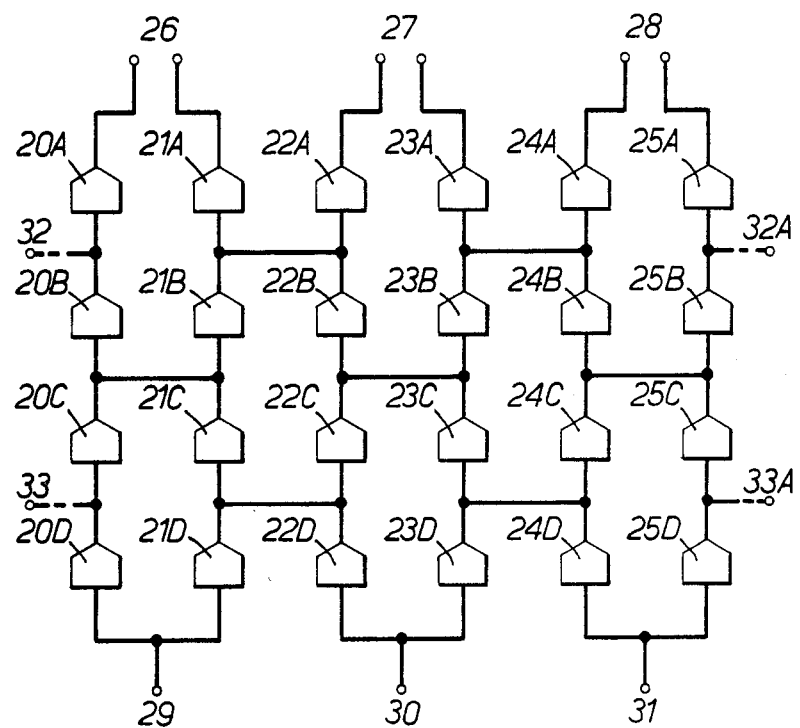
FIG. 3 is a diagram of a bridge-linked array of energy-generating elements, constructed in accordance with the present invention.

The array of elements illustrated in FIG. 3 contains no protective diode. This array comprises a matrix of twenty-four energy-generating elements (but it will be apparent that this is an illustrative array, and will represent only one part or a module of a more extensive array of elements). It comprises four rows of elements and six columns of elements. The elements 20A, 20B, 20C and 20C in the first column are connected in series, as are the elements 21A, 21B, 21C and 21D of the second column and elements of each of the other columns.

The junction between the first and second elements (21A and 21B) of the second column of elements is connected to the junction between the first and second elements (22A and 22B) of the third column of elements. The junction between the third and fourth elements (21C and 21D) of the second column of elements is also connected to the junction between the corresponding elements (22C and 22D) of the third column. In a more extensive array, this interconnection of junctions is described by the more general statement that (a) the elements in each column are connected in series (that is, the positive pole of each element is connected to the negative pole of the next adjacent element in the column—except for the end elements in each column);

(b) the positive pole of each second element in a column of the matrix is connected to the positive pole of the corresponding element in one of the two adjacent columns of the matrix; and (c) the positive pole of each alternate second element in a column of the matrix is connected to the positive pole of the corresponding element in the other of the two adjacent columns.

In the array illustrated in FIG. 3, the ends of the columns of the matrix at 26, 27 and 28 are shown as unconnected to each other, whereas the other ends of the columns are connected in pairs at terminals 29, 30 and 31. In practice, if a single output from the array of elements is required, the ends of each column at 26, 27 and 28 will be connected to a common positive terminal, and the terminals 29, 30 and 31 will be connected to common negative terminal. If three separate outputs from the illustrated array of elements are required, a convenient arrangement will be one in which one output has a positive terminal for the two ends at 26 and negative terminal 29, a second output has a positive terminal for the two ends at 27 and a negative terminal 30, and the third output has a positive terminal for the two ends at 28 and a negative terminal 31. Other arrangements involving a plurality of outputs can be provided, of course.

The array as illustrated in FIG. 3, having an even number of columns in the array matrix, has an advantage in that (a) it can form a module of an extensive array by interconnection with other, similar modules, at terminals 29, 30, 31, 32, 33, 32A, 33A, and with terminals at 26, 27 and 28; and (b) by electrically connecting together terminals 32 and 32A, and also connecting together terminals 33 and 33A, the mathematical equivalent of a tubular matrix array is formed—which is particularly convenient as the mathematical analysis of such an array to dtermine its performance is simpler than the analysis of an array having unconnected edge junctions.

Figure 4A:
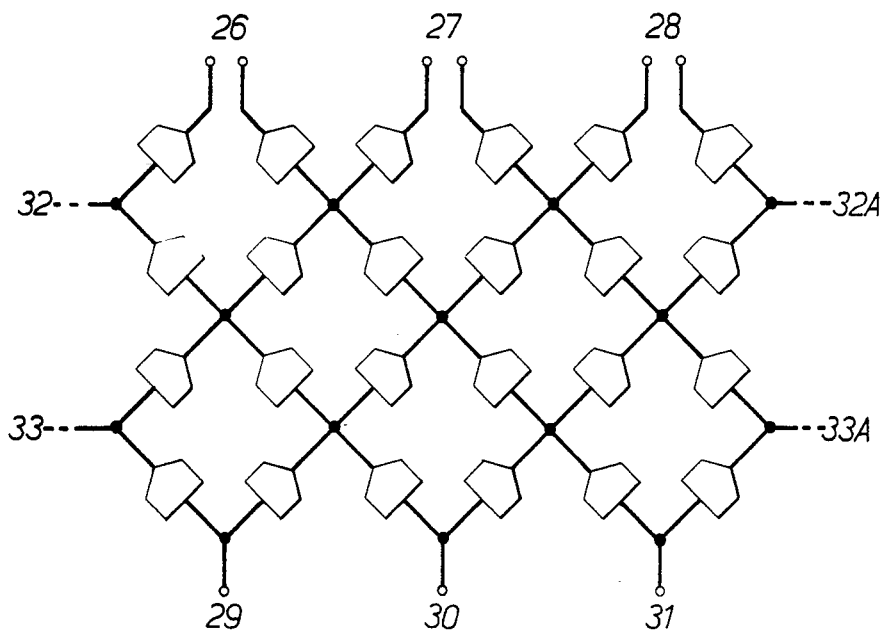
FIGS. 4(a) and 4(b) are different representations of the bridge-linked array of FIG. 3.
Figure 4B:
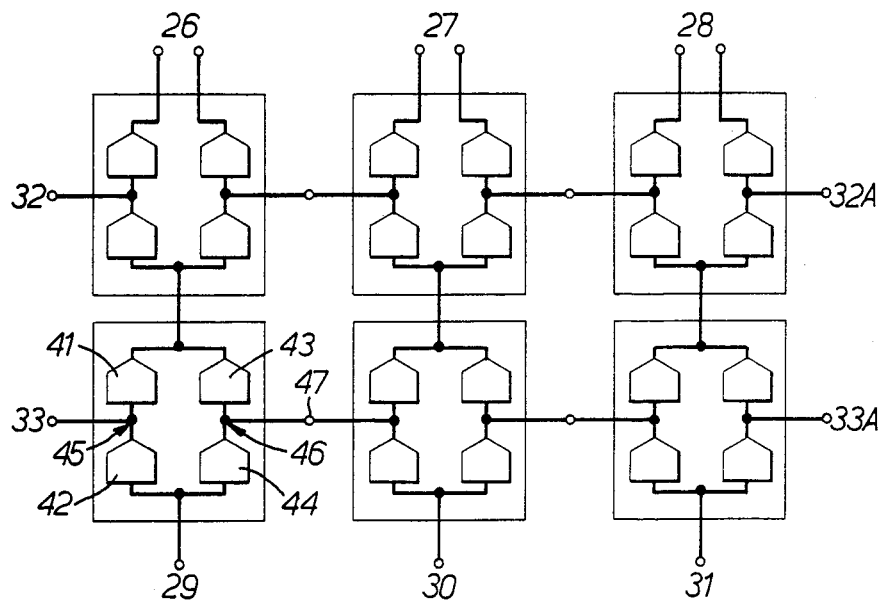

Persons of ordinary competence in this art will recognise that FIGS. 4(a) and 4(b) illustrate the array of FIG. 3 in alternative ways, but the arrays of FIGS. 3, 4(a) and 4(b), in fact, are electrically identical.

FIG. 4(b) is a simplified array configuration. The components of this simplified array each comprise a group of four polarised energy-generating elements 41, 42, 43, and 44. Each group has two pairs of series-connected elements (41 and 42; 43 and 44) and the pairs of series-connected elements are connected in parallel. The series junction (45, 46) of each series-connected pair of elements is connected to a respective terminal (33, 47) which is also connected to series junction of one of the pairs of elements of an adjacent group. The group of four elements that is used as the basic building block of the array of FIG. 4(b) can be constructed as a single module, for the convenience of persons who wish to build an extensive array.

Other diagrammatical representations of arrays of elements connected to form the present invention are possible.

Figure 5:
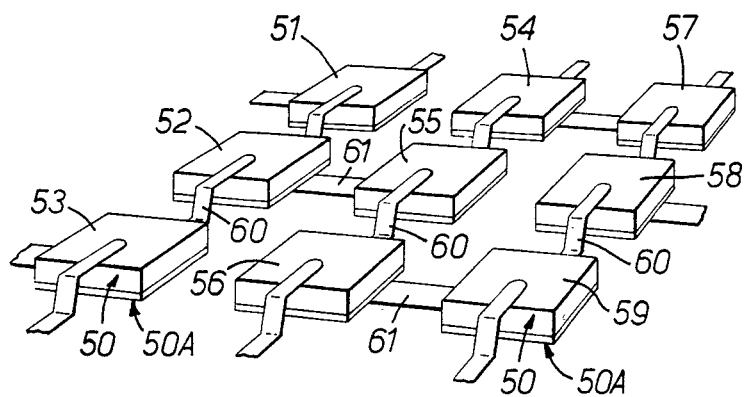
FIG. 5 illustrates schematically how solar cells may be interconnected in an array of the type depicted in FIG. 3 or FIG. 4.

In FIG. 5, a plurality of solar cells 51, 52, . . . 58,59 are represented by thin rectangular wafers. Each wafer comprises a layer of doped silicon 50 mounted on a conducting base plate 50A. A plurality of conducting straps 60 connect, respectively, the front contact (not shown) on the upper surface of each silicon layer 50 with the base plate 50A of an adjacent solar cell to form three columns of series-connected solar cells comprising (i) the cells 51, 52 and 53, (ii) the cells 54, 55 and 56, and (iii) the cells 57, 58 and 59. A plurality of other conducting straps 61 connect the base plates 50A of (a) cells 52 and 55, (b) cells 54 and 57, and (c) cells 56 and 59. With one common type of silicon solar cell, the illuminated upper surface develops a negative voltage relative to the nonexposed surface (to which a base plate is normally affixed). If this type of cell is used, the interconnection by straps 61 of the solar cells depicted in FIG. 5 is equivalent to connecting together the positive poles of (a) cells 52 and 55, (b) cells 54 and 57, and (c) cells 56 and 59.

In practice, a typical solar cell has a base plate 50A forming a positive electrode to which electrical connections may be made. It also has a front contact consisting of thin threads of metal which have been deposited (by known techniques) on the upper surface of the silicon layer. A conductor serves to collect the current from the cell and also to provide an electrical connection to the front contact. The arrangement of thin threads and tapered conductor thus forms a "negative electrode" of the solar cell. (Other configurations of "negative electrode" are available, as are solar cells which have their silicon layer doped so that the base plate forms a negative electrode and the front contact arrangement forms a positive electrode.)

Figure 6:
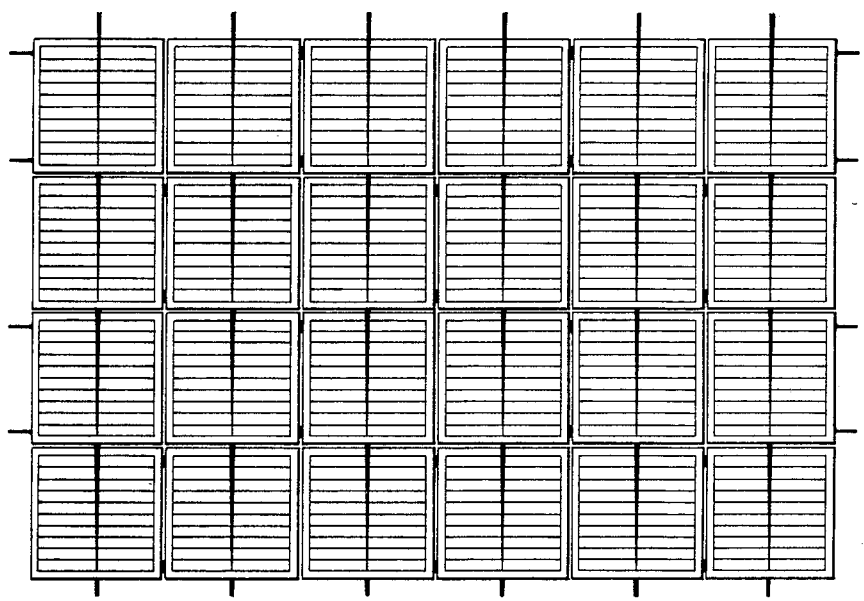
FIG. 6 depicts actual solar cells interconnected to form a module of a bridge-linked array of solar cells constructed in accordance with the present invention.

An array of solar cells, connected in accordance with the present invention, is shown in FIG. 6. This Figure has been included to show (a) the spacing that is usually available between solar cells, (b) the negative electrode configuration of solar cells manufactured by the Solarex Company, and (c) the practical precaution of using a double electrical connection between base plates (positive electrodes) of Solarex solar cells.

A mathematical analysis of an output of an array of energy-generating elements formed in accordance with the present invention is difficult. To investigate whether a fully functional array of the present invention would have a comparable output to a conventional series-parallel connected array, two arrays of thirty-six solar cells were constructed using Solarex solar cells. One of these arrays comprised a matrix of six rows and six columns, connected as shown in FIG. 3, but with the equivalent side terminals 32, 33, 32A and 33A not connected to any other terminal; the other was arranged as a series-parallel connected array with a voltage output equivalent to the voltage that would be generated by six cells in series. The performances of these two arrays were then compared under identical illumination conditions, using the apparatus shown in FIG. 7.

Figure 7:
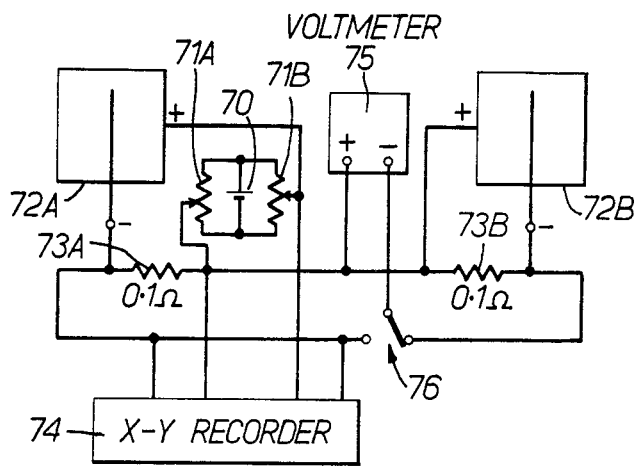
FIG. 7 is a diagram of apparatus used to compare the characteristics of two arrays of solar cells.

The apparatus of FIG. 7 was designed to measure solar cell characteristics under load—including open circuit voltage and short-circuit current. It has also been used to compare the generating characteristics of arrays of solar cells.

In FIG. 7, a voltage source consists of a battery 70 and independently adjustable rheostats 71A and 71B. The voltage established by this source is applied to the output terminal of an array 72A of solar cells through a 0.1 ohm resistor 73A. The voltage developed across the 0.1 ohm resistor 73A (which, in practice, is usually a length of resistance wire) allows the array output current to be calculated. The voltage across resistor 73A is usually made the Y input of XY recorder 74. The X input of recorder 74 is then the voltage appearing between the positive and negative terminals of the array 72A of solar cells.

To measure the output characteristics of different arrays of solar cells, each array in turn becomes array 72A. To ensure that each of the arrays experiences the same illumination, a fixed array 72B is included in the measuring apparatus. The array 72B develops a voltage across resistor 73B, which is of the same type and has the same value as resistor 73A. Monitoring the illumination conditions with the array 72B of solar cells ensures that a correct comparison of successively measured arrays of solar cells 72A is made.

The voltmeter 75 displays the voltage across resistor 73A or resistor 73B, depending on the position of switch 76.

Using the voltage source shown in FIG. 7 enables the voltage across the arrays to be negative, as well as positive. This equipment also enables the reverse current through the array, beyond the open circuit voltage, to be measured.

Figure 8:
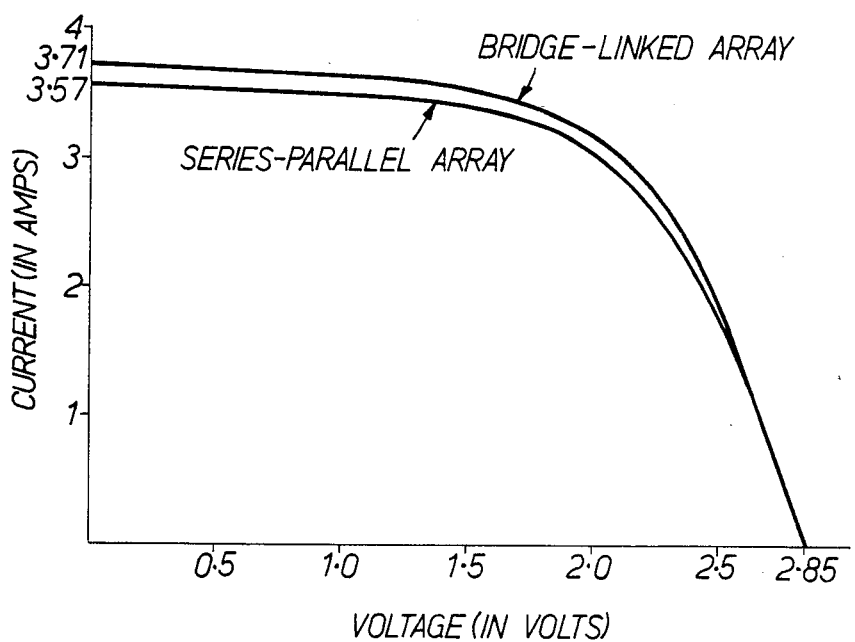
FIG. 8 is a pair of characteristics obtained using the equipment illustrated by FIG. 7.

FIG. 8 shows actual traces of an X-Y recorder that constitute the operating characteristics of the measured arrays. It is apparent that in this experimental comparison of the arrays, the output of the array which has been constructed in accordance with the present invention is at all times better than the series-parallel connected array of solar cells. Thus there is clearly no inherent disadvantage in adopting the present invention rather than using a series-parallel connected array of solar cells.

In experiments involving various instances of shadowing arrays of solar cells constructed in accordance with the present invention, no evidence has been found of the "serious decrease in output" which is claimed by Feldman et al in page 421 of their aforementioned paper (at column 2, lines 9 and 10).

It will be clear to those persons who use solar cells that the present invention, when applied to arrays of solar cells, is applicable to arrays of conventional solar cells and also to bifacial solar cells (such as bifacial solar cells of the type described by A. Cuevas et al in their paper in "Solar Energy", Volume 29, No. 5, pages 419 to 420, 1982).

Among the benefits of the present invention are the ability to create printed arrays of energy-developing elements which are amenable to such techniques (such as solar cells) and, especially when dealing with solar cells, the relaxing of the need to match the characteristics of the elements when constructing an array.

INDUSTRIAL APPLICABILITY

The present invention can be applied to arrays of solar cells, batteries, thermo-electric generators, and capacitors. In its application to solar cell technology, it will be particularly advantageous in the shadowing situations described by J. Feldman et al in their aforementioned paper, in large terrestrial arrays and in solar cell arrays adapted to be carried by satellites.

What is claimed is:

1. An array of polarised energy-generating elements, the elements in the array being formed as a matrix having a plurality of rows of elements and a plurality of columns of elements, with the elements in each row and column being polarised in the same direction, characterised in that (a) the positive pole of each element in each column is connected to the negative pole of the next adjacent element in the column;

(b) the positive pole of each second element in a column is connected to the positive pole of the corresponding element of one of the two adjacent columns; and (c) the positive pole of each alternate second element in a column is connected to the positive pole of the corresponding element in the other of the two adjacent columns.

2. An array as defined in claim 1, further characterised in that the positive poles of the elements at the positive end of each column are connected to a common positive terminal, and the negative poles of the elements at the negative end of each column are connected to a common negative terminal.

3. An array as defined in claim 2 in which each element is a solar cell.

4. An array as defined in claim 3 in which each solar cell is a bifacial solar cell.

5. An array as defined in claim 2 in which each element is a battery.

6. An array as defined in claim 2 in which each element is a thermoelectric generator.

7. An array as defined in claim 2 in which each element is a capacitor.

8. An array as defined in claim 1 further characterised in that there are an even number of columns in the array and the junctions between the alternate pairs of elements in the leftmost column of the matrix are connected, respectively, to the junctions between the alternate pairs of elements in the rightmost column of the matrix.

9. An array as defined in claim 8 in which each element is a solar cell.

10. An array as defined in claim 9 in which each solar cell is a bifacial solar cell.

11. An array as defined in claim 8 in which each element is a battery.

12. An array as defined in claim 8 in which each element is a thermoelectric generator.

13. An array as defined in claim 8 in which each element is a capacitor.

14. An array as defined in claim 1, composed of distinct units in which the number of elements is four, arranged as two columns and two rows, each of two elements, such units being further characterised in that (a) the elements in each column are connected in series;

(b) the two columns of elements are connected in parallel; and (c) the junction between the series-connected elements in each column is connected to a respective terminal, whereby these units may be used as modules in a more extensive array of elements.

15. An array as defined in claim 14 in which each element is a solar cell.

16. An array as defined in claim 15, in which each solar cell is a bifacial solar cell.

17. An array as defined in claim 14 in which each element is a battery.

18. An array as defined in claim 14 in which each element is a thermoelectric generator.

19. An array as defined in claim 14 in which each element is a capacitor.

20. An array as defined in claim 1, in which each element is a battery.

21. An array as defined in claim 1, in which each element is a thermoelectric generator.

22. An array as defined in claim 1, in which each element is a capacitor.

23. An array as defined in claim 1 further characterised in that there are an even number of columns in the array and the junctions between the alternate pairs of elements in the leftmost column of the matrix are connected, respectively, to the junctions between the alternate pairs of elements in the rightmost column of the matrix.

24. An array as defined in claim 23 in which each element is a battery.

25. An array as defined in claim 23 in which each element is a thermoelectric generator.

26. An array as defined in claim 23 in which each element is a capacitor.

27. An array as defined in claim 23 in which each element is a solar cell.

28. An array as defined in claim 27 in which each solar cell is a bifacial solar cell.

29. An array as defined in claim 1 in which each element is a solar cell.

30. An array as defined in claim 29 in which each solar cell is a bifacial solar cell.

* * * * *